United States Patent [19]

Pampalone et al.

[11] Patent Number: 4,621,042

[45] Date of Patent: Nov. 4, 1986

[54] ABSORPTIVE PLANARIZING LAYER FOR OPTICAL LITHOGRAPHY

[75] Inventors: Thomas R. Pampalone, Morris County; James J. Di Piazza, Mercer County, both of N.J.

[73] Assignee: RCA Corporation, Princeton, N.J.

[21] Appl. No.: 766,285

[22] Filed: Aug. 16, 1985

[51] Int. Cl.$^4$ ............................ G03C 1/76; B05D 3/02
[52] U.S. Cl. ...................... 430/271; 430/272; 430/311; 430/316; 430/330; 427/82; 427/379
[58] Field of Search ............ 430/271, 312, 330, 273, 430/272, 316, 311; 427/82, 379

[56] References Cited

U.S. PATENT DOCUMENTS 4,173,470 11/1979 Fahrenholtz et al. ................. 430/5
4,427,713 1/1984 White et al. ...................... 427/54.1

OTHER PUBLICATIONS

Pampalone, Solid State Technology, Jun. 1984, pp. 115-120.
O'Toole et al., SPIE, vol. 275, Semiconductor Microlithography VI, 1981, pp. 128-135.
White, J. Electrochem. Soc., vol. 130. No. 7, pp. 1543-1548, 1983 (White I).
White, J. Vac. Sci. Technol. B1(4), pp. 1235-1240, 1983 (White II).
Lin, Solid State Technology, May 1983, pp. 105-112.
Kaplan et al., RCA Review, vol. 44, Mar. 1983, pp. 135-156.
Namatsu et al., J. Vac. Sci. Technol., vol. 21, No. 2, pp. 672-676, 1982.
Ting et al., Preprints Kodak Microelectronics Seminar, Interface 82, Oct. 1982, pp. 139-149.
Janus, Solid State Technology, Jun. 1973, pp. 33-36.

*Primary Examiner*—John E. Kittle
*Assistant Examiner*—José G. Dees
*Attorney, Agent, or Firm*—B. E. Morris; R. H. Swope

[57] ABSTRACT

The use of o-cresol novolac resin for planarizing large topographic features on a semiconductor substrate is disclosed. In addition to being a superior planarizing material, o-cresol novolac resin oxidizes and darkens upon baking to provide excellent absorption capability for the light wavelengths which are conventionally utilized to irradiate photoresist compositions. O-cresol novolac resin additionally transmits light at higher wavelengths which are used to align pattern masks with alignment keys on a substrate. These properties further make a transparent substrate coated with a patterned layer of o-cresol novolac resin useful as a lithographic mask.

10 Claims, No Drawings

ABSORPTIVE PLANARIZING LAYER FOR OPTICAL LITHOGRAPHY

This invention relates to an improved planarizing layer for optical lithography which is absorptive in the light range commonly used for irradiation.

BACKGROUND OF THE INVENTION

The increasing demand for very-large-scale-integrated (VLSI) devices has made imperative the development of techniques for multilevel metallization, multilayer resist processing, and the like. These developments necessitate utilization of layers of planarizing material to smooth uneven topography on the substrate so that there will be minimal thickness variation in, e.g., a subsequently spun-on coating of resist material. The need to effectively planarize such resist coatings increases as device dimensions shrink.

In addition to causing changes in the thickness of overlying layers, substrate topography can cause optical interference by reflection of the irradiating beam. This can be very detrimental to precise pattern replication in the resist layer. The problem is often exacerbated by the irradiation source itself. The fine-line resolution required for pattern definition approaching one micrometer is conventionally obtained with step-and-repeat projection imaging equipment utilizing essentially monochromatic light. Monochromatic light, however, generates a high incidence of reflection interference. Furthermore, the depth-of-focus of lenses for projection imaging equipment is being reduced in an effort to obtain submicrometer resolution. The use of such lenses increases the need for the surface of the photoresist structure to be as even as possible. These problems are conventionally alleviated by using a multilayer resist system.

A multilayer resist system is comprised of a thick planarizing layer and a thin photoresist imaging layer which may be separated by a thin inorganic hardmask layer impervious to oxygen reactive etching (RIE). The imaging layer is irradiated, developed and the exposed portion of the underlying planarizing and, if present, hardmask layers removed. The system containing the hardmask layer is generally regarded as providing better resolution. It is conventional with either system to incorporate a dye into the planarizing layer to prevent loss of resolution resulting from substrate reflection.

The selection of a suitable dye for multilayer photoresist structures is complicated by the fact that a number of criteria must be met. An acceptable dye must be exceptionally pure to prevent contamination of the device being fabricated, have a high solubility in the high-boiling solvent utilized to spin-coat the substrate and have the proper absorbance characteristics. This latter requirement is the most demanding because of improvements in irradiation equipment. The newer imaging apparatus, termed "I-line", utilize wavelengths below 436 nm, e.g. 366 nm, to irradiate the photoresist layer to maximize resolution, and longer wavelengths, i.e. 514 nm and above, to align the exposures, i.e. the imaging mask with the substrate. To insure proper alignment, a dye must transmit light at the higher wavelengths while effectively absorbing light at the irradiating wavelengths.

In addition to the problem of dye selection, there also remains the problem that, even though multilayer systems provide improved resolution over a single layer of photoresist, it is difficult to effectively planarize large topographical features with the planarizing materials conventionally in use at the present time. Examples of large topographical features include island features in excess of about 30 micrometers square, particularly those in excess of about 50 micrometers square, and other features of comparable dimensions. It is necessary to effectively planarize such large features in order to obtain high resolution from the photoresist pattern. The difficulty in achieving effective planarization will be appreciated when it is considered that, using a thin imaging photoresist layer, i.e. about 0.5 micrometer in thickness, a step height greater than about 0.1 micrometer in the planarizing layer will produce greater than 20 percent deviation in the thickness of the imaging resist layer.

In accordance with this invention there is provided a material with excellent planarizing properties which additionally possesses the requisite absorbing properties discussed above without the incorporation of a dye.

SUMMARY OF THE INVENTION

Large topographical features on a substrate for semiconductor fabrication are effectively planarized by a layer of ortho-cresol novolac resin which also serves as a light absorbing medium. Due to the excellent light absorbing capacity of this resin, a patterned layer thereof on a transparent substrate may be used as a photomask.

DETAILED DESCRIPTION OF THE INVENTION

Cresol novolac resins are art-recognized planarizing materials used in photolithography. These resins are condensation products of formaldehyde and cresol resins which exist in three isomeric forms as represented by the following formulae

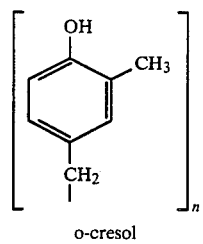

o-cresol

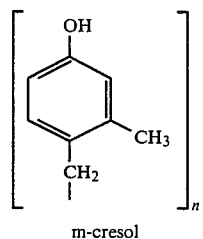

m-cresol

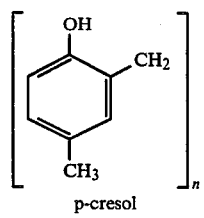

p-cresol wherein n is from about 6 to 20. It is known that novolac resins will flow when heated and will planarize substrate topography to varying degrees. Heretofore, however, it has not been recognized that cresol novolac resins would be effective as absorptive layers.

The planarizing material of this invention is comprised of pure ortho-cresol novolac resin. The term "pure" as utilized herein with regard to ortho-cresol novolac resin does not exclude minor amounts of para- and meta-cresol novolac resins which may be unavoidably present as a result of the method of preparation. Individual resin preparations may vary due to molecular weight as well. Such variations are within the scope of the present invention and are referred to herein in the singular form. It is essential, however, that such preparations do not contain the para and meta isomers in sufficient concentration so as to adversely affect the critical properties of the ortho isomer, i.e. that it not be rapidly thermosetting at the temperature used to reflow it to planarize surface topography, and that it effectively absorb the light utilized to irradiate an overlying resist layer.

In accordance with this invention, ortho-cresol novolac resin is suitably dissolved in an organic solvent such as propylene glycol methylether acetate, ethylene glycol ethylether acetate and the like, and applied to the substrate, suitably by spin-coating. The substrate may be any suitable material, for example, single crystal silicon, gallium arsenide, metallic silicides, polycrystalline materials with suitable surfaces, vitreous materials or the like. Large topographical features on the substrates may be of the same or a different material.

The absorptive characteristics of ortho-cresol novolac resin make it particularly suitable for use as a lithographic mask material. For such purpose it is deposited onto a transparent surface such as glass or quartz. The use of ortho-cresol novolac resin for lithographic masks is advantageous over conventional materials such as chromium on glass because the surface is nonreflective, thus making mask alignment much easier. The subject resin is also advantageous over chromium because it adheres to the substrate much better than chromium, it is not easily scratched and is free of pinholes in the thicknesses contemplated herein.

A significant advantage of photomasks prepared from the subject resin is in the relative ease of mask alignment in comparison to chromium. The opacity of chromium requires that alignment keys be in the mask, thus making alignment both difficult and time-consuming. Masks formed from the subject resin, in contrast, transmit sufficient light above 450 nm to permit alignment keys in the substrate, thus greatly simplifying alignment.

The thickness of the subject resin when utilized as a planarizing coating will depend to an extent on the step height of topography on the substrate. Generally, the coating will be between about one and two and one-half, preferably about two, micrometers in thickness for a step height of 0.5 to 1.0 micrometer. This is sufficient to planarize most topographical features since step height is generally not in excess of about one micrometer. Coatings of ortho-cresol novolac resin on a transparent substrate for lithographic mask preparation are suitably from one to four micrometers thick.

The concentration of the resin in the solvent utilized to planarize or coat the substrate will vary with the mode of application and the desired thickness of the coating. Generally, the coating composition will contain from about 20 to about 50 percent by weight of the resin. The coating is suitably soft-baked at from about 90° to about 100° C. for about 5 to 30 minutes to drive off most of the solvent, and then hard-baked at from about 140° to 250° C., preferably about 200° C., for from about 10 to 30 minutes to reflow the resin and planarize surface topography. It is necessary that the final baking step be carried out in an oxidizing environment such as air, so that the resin is oxidized and cross-linked, thus making it absorptive. If the hard bake were carried out in an inert ambient, the resin coatings would be reflowed to planarize substrate topography, but would remain clear, and thus be ineffective as an absorption layer. It is readily appreciated that, if the resin coating remained clear, it would also be of no value as a lithographic mask material.

The conditions under which a layer of ortho-cresol novolac resin is baked will influence its transmission characteristics. For example, a ten minute bake of a two micrometer thick coating at 200° C. is required to lower its transmission at 436 nm to under about five percent. Twenty-four minutes at 200° C. will lower the transmission at 436 nm to about one percent, a necessary level for use of the coating in the production of lithographic masks. In accordance with this invention, the resin coating is hard-baked under conditions such that the transmission of light at 436 nm will be less than about five percent, preferably less than about one percent.

The planarizing material of this invention has been found to effectively planarize large topographical features, e.g. islands on a substrate, 0.62 micrometer high and 100 micrometers square. Such islands are commonplace in electronic device design. Using conventional novolac resist preparations, the step height of such topography was reduced to an average of only about 0.5 micrometer using a two micrometer thick coating of the particular material. A two micrometer thick coating of the subject planarizing materials reduced the step height of the same islands to less than 23 nanometers, an improvement of over 20 fold.

After the planarizing layer has been hard-baked, a photoresist layer or a hardmask layer/photoresist layer structure is deposited thereover, suitably by conventional techniques such as spin-coating. When a hardmask layer is present, it is generally deposited by chemical vapor deposition. The photoresist may be either positive or negative and is suitably resistant to oxygen plasma. The final thickness of the photoresist layer is generally from about 0.5 to 2, suitably about 0.5 micrometer. Suitable commercial photoresists include diazoquinone/novolac resin type resists such as Microposit 1400-30 of the Shipley Co., AZ 1350J-SF of American Hoechst Corporation, HP-204 of Philip A. Hunt Chemical Corporation and the like.

It is also with the scope of this invention to form a photoresist preparation from ortho-cresol novolac resin by the incorporation of an effective amount of a conventional photoinitiator therein. Such compounds, suitably a diazoquinone photoinitiator, and their use are well known to those of ordinary skill in the art. The compositions of this invention contain from about 10 to 30 percent by weight of the photoinitiator, based on the weight of the resin.

The photoresist layer is irradiated through a suitable mask with UV light, typically in the range of 350 to 450 nm, utilizing conventional equipment, and then wet developed with the reagent recommended by the manufacturer. Wherein the subject compositions contain a photoinitiator, they are soft-baked, patterned, irradiated with deep UV light to prevent thermal flow, and then hard-baked as described above.

When utilized in a multilayer imaging system, the portion of the subject planarizing/absorptive layer exposed by development of the photoresist layer is suitably dry developed using an oxygen plasma. The parameters of the oxygen plasma etch may vary within conventionally recognized ranges. Where a hardmask layer is present, it is also suitably removed in a plasma such as a conventional fluorocarbon etch. The subject planarizing/absorptive layers possess excellent image resolution down to the substrate with minimal loss of photoresist. When the subject absorptive layers are coated onto a transparent substrate for lithographic mask preparation, it is preferred that development of the entire structure be anisotropic using conventional plasma techniques.

The planarizing/absorptive layers of this invention provide excellent pattern resolution, particularly over substrate topography heretofore considered to be difficult to planarize. It is considered unexpected that orthocresol novolac resin, in addition to being an excellent planarizer, effectively absorbs irradiating light in the wavelength of 436 nm and below in view of the fact that commercial cresol novolac resin planarizers are not regarded as being useful as absorptive layers.

The following Examples further illustrate this invention, it being understood that the invention is in no way intended to be limited to the details described therein. In the Examples, all parts and percentages are on a weight basis and all temperatures are in degrees Celsius, unless otherwise stated.

CONTROLS

A number of commercial novolac resin photoresist compositions which are conventionally used as planarizing materials were tested for their ability to planarize large topographical features on the surface of a substrate. The substrates utilized for all experiments were silicon wafers containing islands comprised of a layer of polycrystalline silicon having thereover a layer of highly reflective tantalum disilicide. The islands were 100 micrometers square, 0.62 micrometer high and spaced 80 micrometers apart. Such topography is typical of that present on a substrate surface during lithographic processing of an IC device. Such topography is also typical of topography which is considered difficult to planarize effectively. The following resins were tested.

Microposit 1400-30—Shipley Corporation. This material, a positive photoresist containing about 24 percent of novolac resin, was spun onto the substrate to a thickness of two micrometers. The coating was soft-baked at 90° for 30 minutes and then hard-baked at 200° for 10 minutes in a Wafertrac oven (GCA Corporation) to decompose the photoactive component and flow the material. The final thickness of the layer after hard bake was 1.89 micrometers.

The planarization profiles were measured with a Tencor Alpha-step profilometer with a 12 micrometer radius stylus and a 15 mg stylus tracking force. The step height was reduced to only 0.59 micrometer with rounded edges. This is not considered satisfactory planarization.

AZ Protective Coating—American Hoechst Corp. This material, a novolac resin solution, was coated and processed as above. The surface profile was reduced to only 0.56 micrometer, an unacceptable result. Heating the substrate to 250° for 20 minutes produced no change in step height. The planarizing coating was found to be insoluble in acetone. This indicates that cross-linking has taken place. Additionally, substrates coated with this material were hard-baked at 145° for 30 minutes in a convection oven. The planarizing layer was found to be insoluble in acetone. In no instance was the step profile reduced to less than 0.55 micrometer.

Alnovol 429—American Hoechst Corp. This material, a novolac resin used in photoresist compositions, was initially dissolved in propylene glycol methylether acetate to form a 30 percent solution. The solution was spun on the wafer, soft baked at 90° for 30 minutes, and then hard-baked at 250° for 10 minutes in the Wafertrac oven. The thickness of the coating after hard bake was 2.0 micrometer. The step height after hard bake was still greater than 0.55 micrometer. The planarizing coating was insoluble in acetone.

A 30 percent solution of the same resin in DMSO, a high-boiling solvent, was prepared and spin-coated onto additional test wafers. Spin time was only 8 seconds to minimize solvent loss. The wafer was hard-baked at 195° for 10 minutes in the Wafertrac oven. The profile measurement showed the step height to be reduced to an average of about 0.42 micrometer. The improved flow of the resin is believed to result from the longer retention of the solvent during bake. Use of the high boiling solvent, although an improvement, does not produce an acceptable planarization of large topographical features.

Polystyrene—For a further comparison, polystyrene, which has been proposed in the literature as a planarizing layer material, was dissolved in propylene glycol methylether acetate to produce an 8 percent solution which was, in turn, spin-coated onto test wafers at 1600 rpm. The polystyrene had a $M_w$ of 670,000 and $M_n$ of 640,000. The coating was 2.0 micrometers thick after baking.

After the substrate had been baked at 250° for 10 minutes in the Wafertrac oven, the step height increased to 0.7 micrometer. The wafer was then heated to 300° in the Wafertrac oven to melt the polystyrene. Although the step height was reduced to 0.16 micrometer, the polystyrene flowed unevenly producing puddling. On the theory that the poor flow was the result of poor wetability of the substrate surface, the test was repeated utilizing wafers whose surface had been primed with hexamethyldisilazane (HMDS). The results were the same. Although an experiment in planarization was achieved in this experiment, the uneven flow of the polystyrene was considered unacceptable.

Utilizing a visible/UV spectrophotometer, the transmission of each coating was tested to determine its capacity to absorb the irradiating light thereby preventing loss of pattern definition due to reflection from the highly reflective tantalum disilicide. The results are reported in Table I in terms of the amount of light transmitted through each coating at a given wavelength.

TABLE I

| Planarizing Material | Percent Transmission | | | |
|---|---|---|---|---|
| | 600 nm | 514 nm | 436 nm | 366 nm |
| Microposit 1400-30 | 43 | 42 | 33 | 21 |
| AZ Protective Coating | 42 | 39 | 32 | 20 |
| Alnovol 429 | 40 | 36 | 31 | 20 |
| Polystyrene | 98 | 98 | 98 | 98 |

EXAMPLE 1

O-cresol novolac resin, Varcum 29-801 by Reichold Chemical Co., prepared as a 35 percent solution in propylene glycol methylether acetate, was spin-coated onto a test wafer having the same topography as in the control experiments. The wafer was heated in the Wafertrac oven for 6 minutes at 90° and then for 10 minutes at 200°. The thickness of the resulting coating was 2.0 micrometers. The step height was reduced from 0.62 micrometer to under 800 angstroms (0.08 micrometer), an excellent result. The absorptive capacity of the film was determined in the same manner as the control resins. The results are given in Table II.

TABLE II

| | Percent Transmission | | |
|---|---|---|---|
| 600 nm | 514 nm | 436 nm | 366 nm |
| 77 | 20 | 2 | 4 |

These results show that the o-cresol novolac resin film effectively absorbs light at the irradiating wavelengths of 436 nm and below while transmitting light at the wavelengths of 514 nm and above.

As series of five additional wafers having the same surface topography was coated with o-cresol novolac resin, soft-baked at 90° for 6 minutes and then hard-baked for 10 minutes at various temperatures. The coating was 2 micrometers thick after hard bake in each instance. The effect of these temperature variations on step height is shown in Table III. The solubility of each film in acetone was also determined and is given in Table III.

TABLE III

| Temperature | Step Height In Angstroms | Solubility in Acetone |
|---|---|---|
| 120 | 1300 | soluble |
| 140 | 460 | soluble |
| 160 | 685 | soluble |
| 200 | 800 | insoluble |
| 250 | 900 | insoluble |

A second series of four wafers having the same topography was coated with varying thicknesses of the resin composition. The wafers were soft-baked at 90° for 6 minutes and hard-baked at 140° for 10 minutes. The correlation between coating thickness and step height is given in Table IV. In each instance, the coating thickness is after hard bake.

TABLE IV

| Coating Thickness Micrometers | Step Height Angstroms |
|---|---|
| 0.8 | 6300 |
| 1.2 | 3600 |
| 1.6 | 1280 |
| 2.0 | 230 |

It is apparent from the data in Tables III and IV that a 2.0 micrometer coating, hard-baked between 140° and 200° for at least ten minutes, gives optimum planarization.

EXAMPLE 2

A wafer having the same topography as was utilized for the controls was coated with a 2 micrometer thick planarizing layer of o-cresol novolac resin in the manner described in Example 1. The planarizing layer was coated with 200 nm of silicon nitride by plasma enhanced chemical vapor deposition.

The positive photoresist AZ 1350B was spin-coated over the silicon nitride layer and baked at 90° for 15 minutes to yield a resist layer 0.5 micrometer thick. The structure was irradiated with a TRE I-line stepper (TRE Semiconductor Equipment Corporation) utilizing a conventional mask. There was no difficulty aligning the mask with alignment keys in the wafer. The alignment step was carried out at 514 nm. Once the mask was properly aligned, the wafer was pattern irradiated at 366 nm. The wafer was immersed in Waycoat HPR LSI Developer, Philip A. Hunt Chemical Corp., diluted 1:1 with deionized water, for 60 seconds to remove the irradiated portion of the photoresist layer. The wafer was placed in a conventional plasma reactor. The exposed portion of the silicon nitride was cleanly etched utilizing a conventional fluorocarbon etch and the planarizing layer was anisotropically etched in an oxygen plasma. There was no distortion of the pattern due to surface reflection of the irradiating light.

EXAMPLE 3

Conventional single crystal silicon wafers having a polished surface were coated with a 2 micrometer thick coating of o-cresol novolac resin which was soft-baked at 90° for 6 minutes and hard-baked at 200° for 10 minutes. The resin surface was tested with a profilometer for random variations in the surface, i.e. surface roughness. The variations in the areas tested were between 6.5 and 30 nm.

A conventional silicon oil coating additive was added to the o-cresol novolac resin solution to a concentration of 0.05 percent and the process repeated. No surface roughness could be detected in the cured film. The detection limit of the profilometer was 5 nanometers.

EXAMPLE 4

Conventional single crystal silicon wafers having a polished surface were coated with o-cresol novolac resin which was soft-baked at 90° for 6 minutes to yield a 2.2 micrometer thick coating. Each of seven such wafers was hard-baked under varied conditions of temperature and time. The absorptive properties of the coatings were determined and are reported in Table V.

TABLE V

| Hard Bake | Percent Transmission | | |
|---|---|---|---|
| | 514 nm | 436 nm | 366 nm |
| none | 87 | 82 | 83 |
| 160°/10 min. | 85 | 79 | 79 |
| 200°/3 min. | 83 | 76 | 71 |
| 200°/6 min. | 46 | 8 | 17 |
| 200°/12 min. | 19 | 2 | 4 |
| 200°/24 min. | 17 | 1 | 0.5 |
| 250°/12 min. | 14 | 1 | 0.5 |
| 300°/12 min. | 13 | 1 | 0.5 |

It is evident from the data in Table V that the transmission characteristics of the coating can be optimized by proper selection of the hard bake conditions.

EXAMPLE 5

A 4×4 inch quartz plate was spin-coated with the o-cresol novolac solution of Example 1, soft-baked for 6 minutes at 90° and hard-baked for 30 minutes at 200° to yield a darkened coating 2.0 micrometers thick. Accuglass, spin-on-glass available from Allied Corp. was coated onto the resin layer and baked for 15 minutes at 90° to yield a layer of organic silicon oxide hardmask material 100 nm thick. A layer of the positive photoresist AZ 1350B 0.5 micrometer thick was formed over the hardmask, irradiated with a photomask stepper as in Example 2 and developed to give a pattern of lines and spaces of varying dimensions with the finest being 0.75 micrometer lines and 1.0 micrometer spaces.

The plate was placed in a conventional plasma etcher. The hardmask was etched in a fluorocarbon plasma (Freon 23) and the resin layer was etched in an oxygen plasma. Resolution of the finest pattern was attained.

The resulting photomask was placed into a Model 220 Wafer Aligner (Perkin Elmer Corp.) and used to irradiate conventional photoresist coated wafers. The wafers were conventionally developed. Resolution of the finest pattern, i.e. 10 micrometer lines and 0.75 micrometer spaces, was obtained in the wafers.

EXAMPLE 6

Thirty-five grams of Varcum 29-801 were dissolved in 70 grams of propylene glycol methylether acetate. To the resulting solution was added 5 grams of Sensitizer 1014, Fairmount Chemical Company, a condensation product of naphtho-quinone-(1,2)-diazide-(2)sulfonyl chloride and 2,3,4-trihydroxybenzophenone. The solution was filtered and spun onto a quartz wafer. After a one minute bake at 90°, the coating was 2.3 micrometers thick. The coating was irradiated on a Model 220 Wafer Aligner (Perkin-Elmer Corp.), utilizing a test mask of various arrays of lines and spaces. The coating was developed for one minute with AZ 400 K Developer (American Hoechst Corp.), diluted 1:7 with deionized water. The resolution of the developed pattern was 1.5 micrometer lines and spaces. The wafer was flood irradiated with UV light for 2 minutes to inactivate the sensitizer, and then with deep UV light for 2 minutes with a 126 PC photostabilizer unit (Fusion Semiconductor Systems, Inc.) to cross-link the surface of the resin. The coating was baked at 250° for 30 minutes to darken and harden the pattern. The thickness of the resist layer after baking was 2.0 micrometer.

The wafer containing the patterned layer of resin was utilized as a contact mask to irradiate a silicon wafer containing a 1.7 micrometer thick layer of conventional photoresist. Resolution of 1.5 micrometer lines and spaces was attained in the resist layer. This experiment demonstrates that o-cresol novolac resin can be formulated into a photoresist layer by the inclusion of a conventional photoactivator compound.

EXAMPLE 7

Sufficient poly(hydroxystyrene), $M_w$ 13,500, was dissolved in propylene glycol methylether acetate to form a 26 percent solution. The solution was spin-coated onto substrate wafers having the same topographical features as in the previous examples. The coating was hard-baked in air at 200° for 10 minutes in the Wavertrac oven to yield a clear coating 2.06 micrometers thick. The step height was 760 nm.

The wafer was heated at 300° for an additional 10 minutes, after which the step height measured 320 nm. An additional heating at 300° for 15 minutes reduced the step height to 85 nm. Further heating at 300°, which is the practical limit of the apparatus being used, for 25 minutes produced no further change. It is apparent that poly(hydroxystyrene) is as effective as o-cresol novolac in planarizing surface topography, but requires a substantially longer bake and/or a high baking temperature. The absorptive properties of the film were determined after each baking interval and are reported in Table VI.

TABLE VI

| Bake (min. at 300°) | Percent Transmission | | | |
| --- | --- | --- | --- | --- |
| | 600 nm | 500 nm | 450 nm | 400 nm |
| 10 | 80 | 64 | 54 | 38 |
| 20 | 70 | 51 | 38 | 21 |
| 30 | 70 | 48 | 35 | 13 |

It is readily apparent from Table VI that poly(hydroxystyrene) does not possess the unique properties of o-cresol novolac resin for the present application.

We claim:

1. In a multilayer structure suitable for optical lithography comprising a substrate having topographical features, a layer of planarizing material thereover and a layer of photoresist material overlying the layer of planarizing material, wherein the planarizing material absorbs light at the wavelengths useful to irradiate the photoresist layer, the improvement wherein the planarizing material consists essentially of pure o-cresol novolac resin.

2. A structure in accordance with claim 1, wherein said structure contains a layer of hardmask material interposed between the layer of planarizing material and the layer of resist material.

3. A method of planarizing topographical features on a substrate comprising: applying thereover a coating of a planarizing composition consisting essentially of pure o-cresol novolac resin and a suitable solvent; soft-baking the coating to remove most of the solvent therefrom and hardbaking the coating in an oxidizing atmosphere to oxidize and darken the resin and reflow the coating thereby planarizing the topographical features.

4. A method in accordance with claim 3, wherein the coating is hard-baked under conditions such that the transmission of light at 436 nm through the coating is reduced to less than about five percent.

5. A method in accordance with claim 4, wherein the coating is hard-baked under conditions such that the transmission of light at 436 nm through the coating is reduced to less than about one percent.

6. A method in accordance with claim 3, wherein the composition is applied by spin-coating.

7. A method in accordance with claim 3, wherein the composition contains from about 5 to about 50 percent by weight of the resin.

8. A method in accordance with claim 3, wherein the solvent is propylene glycol methylether acetate or ethylene glycol ethylether acetate.

9. A method in accordance with claim 3, wherein said method additionally includes the step of forming a layer of photoresist material overlying the planarizing layer.

10. A method in accordance with claim 9, wherein said method additionally includes the step of forming a layer of hard mask material overlying the planarizing layer and underlying the layer of photoresist material.

* * * * *